US009588196B2

(12) United States Patent
Harvey et al.

(10) Patent No.: US 9,588,196 B2
(45) Date of Patent: *Mar. 7, 2017

(54) MULTI-CHANNEL TRANSMIT MR IMAGING

(75) Inventors: Paul Royston Harvey, Best (NL); Wilhelmus Reinerius Maria Mens, Vught (NL)

(73) Assignee: KONINKLIJKE PHILIPS N.V., Eindhoven (NL)

( * ) Notice: Subject to any disclaimer, the term of this patent is extended or adjusted under 35 U.S.C. 154(b) by 643 days.

This patent is subject to a terminal disclaimer.

(21) Appl. No.: 13/977,930

(22) PCT Filed: Dec. 27, 2011

(86) PCT No.: PCT/IB2011/055972
§ 371 (c)(1),
(2), (4) Date: Jul. 2, 2013

(87) PCT Pub. No.: WO2012/093321
PCT Pub. Date: Jul. 12, 2012

(65) Prior Publication Data
US 2013/0300415 A1    Nov. 14, 2013

(30) Foreign Application Priority Data
Jan. 6, 2011   (EP) .................................. 11150312

(51) Int. Cl.
*G01V 3/00* (2006.01)
*G01R 33/34* (2006.01)
(Continued)

(52) U.S. Cl.
CPC .......... *G01R 33/34* (2013.01); *G01R 33/3678* (2013.01); *G01R 33/5612* (2013.01); *G01R 33/5659* (2013.01)

(58) Field of Classification Search
USPC ........................................................ 324/309
See application file for complete search history.

(56) References Cited

U.S. PATENT DOCUMENTS 7,135,864 B1    11/2006  McKinnon et al.
2005/0140369 A1    6/2005  Feiweier et al.
(Continued)

FOREIGN PATENT DOCUMENTS

WO    2004061469 A1    7/2004
WO    2008135888 A1    11/2008

OTHER PUBLICATIONS

Graesslin, I., et al.; Whole Body 3T MRI System with Eight Parallel RF Transmission Channels; 2006; Proc. Intl. Soc. Mag. Reson. Med.; 14:129.
(Continued)

*Primary Examiner* — Rodney Fuller

(57) ABSTRACT

The invention relates to a multi-channel (e.g. quadrature) MRI transmit system in which RF power amplifiers having different power capabilities are used in different transmit channels. This results in reduced system costs, due to the avoidance of an unused excess of RF power capability when the power demand for obtaining a homogeneous B1-field (RF shimming) is asymmetric and the asymmetry is qualitatively the same for different imaging applications. The multi-channel transmit unit may also comprise a commutator which enables to selectively connect each RF power amplifier to each drive port of transmit coil arrangement (e.g. a birdcage coil).

8 Claims, 3 Drawing Sheets

(51) Int. Cl.
    *G01R 33/36*       (2006.01)
    *G01R 33/561*    (2006.01)
    *G01R 33/565*    (2006.01)

(56) References Cited

U.S. PATENT DOCUMENTS

| | | |
|---|---|---|
| 2005/0200358 A1 | 9/2005 | Boskamp et al. |
| 2008/0272787 A1 | 11/2008 | Boskamp et al. |
| 2009/0079428 A1 | 3/2009 | Nistler et al. |
| 2009/0189609 A1* | 7/2009 | Eberler ............ G01R 33/34076 324/322 |
| 2010/0136929 A1* | 6/2010 | Vernickel ......... G01R 33/34076 455/91 |
| 2010/0141259 A1* | 6/2010 | Graesslin ............. G01R 33/288 324/318 |
| 2012/0223706 A1* | 9/2012 | Hetherington ... G01R 33/34007 324/307 |
| 2013/0342207 A1* | 12/2013 | Keupp ................ G01R 33/3614 324/309 |
| 2015/0253393 A1* | 9/2015 | Harvey ............ G01R 33/34076 324/322 |
| 2015/0276898 A1* | 10/2015 | Findeklee ........ G01R 33/34046 324/309 |
| 2015/0323623 A1* | 11/2015 | Adalsteinsson .... G01R 33/3657 324/311 |

OTHER PUBLICATIONS

Junge, S., et al.; Integrated Coil-Setup for Multiple-Channel Transmit Applications at 200MHz; 2005; Proc. Intl. Soc. Mag. Reson. Med.; 13:918.

\* cited by examiner

MULTI-CHANNEL TRANSMIT MR IMAGING

FIELD OF THE INVENTION

The invention relates to the field of magnetic resonance (MR) imaging. It concerns a method of MR imaging of at least a portion of a body of a patient placed in an examination volume of a MR device. The invention also relates to a MR device and to multi-channel transmit unit for a MR device.

BACKGROUND OF THE INVENTION

Image-forming MR methods which utilize the interaction between magnetic fields and nuclear spins in order to form two-dimensional or three-dimensional images are widely used nowadays, notably in the field of medical diagnostics, because for the imaging of soft tissue they are superior to other imaging methods in many respects, do not require ionizing radiation and are usually not invasive.

According to the MR method in general, the body of the patient to be examined is arranged in a strong, uniform magnetic field whose direction at the same time defines an axis (normally the z-axis) of the co-ordinate system on which the measurement is based. The magnetic field produces different energy levels for the individual nuclear spins in dependence on the magnetic field strength which can be excited (spin resonance) by application of an electromagnetic alternating field (RF field) of defined frequency (so-called Larmor frequency, or MR frequency). From a macroscopic point of view, the distribution of the individual nuclear spins produces an overall magnetization which can be deflected out of the state of equilibrium by application of an electromagnetic pulse of appropriate frequency (RF pulse) while the magnetic field of the RF pulse extends perpendicular to the z-axis, so that the magnetization performs a precession about the z-axis. This motion of the magnetization describes a surface of a cone whose angle of aperture is referred to as flip angle. The magnitude of the flip angle is dependent on the strength and the duration of the applied electromagnetic pulse. In the case of a so-called 90° pulse, the spins are deflected from the z axis to the transverse plane (flip angle 90°). The RF pulse is radiated toward the body of the patient via a RF coil arrangement of the MR device. The RF coil arrangement typically surrounds the examination volume in which the body of the patient is placed.

After termination of the RF pulse, the magnetization relaxes back to the original state of equilibrium, in which the magnetization in the z direction is built up again with a first time constant $T_1$ (spin lattice or longitudinal relaxation time), and the magnetization in the direction perpendicular to the z direction relaxes with a second time constant $T_2$ (spin-spin or transverse relaxation time). The variation of the magnetization can be detected by means of receiving RF coils which are arranged and oriented within the examination volume of the MR device in such a manner that the variation of the magnetization is measured in the direction perpendicular to the z-axis. The decay of the transverse magnetization is accompanied, after application of, for example, a 90° pulse, by a transition of the nuclear spins (induced by local magnetic field inhomogeneities) from an ordered state with the same phase to a state in which all phase angles are uniformly distributed (dephasing). The dephasing can be compensated by means of a refocusing pulse (for example a 180° pulse). This produces an echo signal (spin echo) in the receiving coils.

In order to realize spatial resolution in the body, linear magnetic field gradients extending along the three main axes are superposed on the uniform magnetic field, leading to a linear spatial dependency of the spin resonance frequency. The signal picked up in the receiving coils then contains components of different frequencies which can be associated with different locations in the body. The signal data obtained via the receiving coils corresponds to the spatial frequency domain and is called k-space data. The k-space data usually includes multiple lines acquired with different phase encoding. Each line is digitized by collecting a number of samples. A set of k-space data is converted to a MR image by means of Fourier transformation.

It is generally desirable to have a relatively uniform homogeneity of the generated RF field ($B_1$ field) for excitation of magnetic resonance throughout a cross section of the imaged portion of the patient's body. However, as the MR frequency increases with increasing main magnetic field strength, this becomes more difficult due to conductive losses and wavelength effects within the body of the patient. Multi-channel transmit MR imaging has been accepted as a standard method of operating volume RF coils to achieve a relatively uniform $B_1$ field. Compared with a single channel mode of operation, a two-channel transmit technique results in a significantly increased $B_1$ homogeneity.

In known multi-channel transmit systems the RF power signal is typically supplied to the RF coil arrangement via RF drive ports being connected to individual resonator elements of the RF coil arrangement. The RF coil arrangement may be a so-called birdcage resonator comprising a plurality of rungs arranged in parallel to a longitudinal axis of the main magnetic field, wherein the birdcage resonator surrounds the imaged body portion. In this case, the RF drive ports are connected to two or more rungs of the birdcage resonator. Two-channel transmit MR systems typically use two independent RF transmit chains and amplifiers for applying the RF power signals to the RF drive ports of the coil arrangement. The RF power applied to the different RF drive ports can be controlled individually in order to optimize the homogeneity of the RF field (so-called RF shimming).

It turns out that different imaging tasks that utilize RF shimming have different RF power demands from each of the two channels. Dual channel shimming can therefore lead to a significantly asymmetric power demand at the two RF drive ports of the RF coil arrangement. The extent of asymmetry depends upon the anatomy in which the RF field homogeneity needs to be optimized and also upon the extent to which shimming is required. Typically, the RF power amplifiers within a multi-channel transmit system have equal power capabilities. However, the asymmetry occurring in the power demand results in a situation in which one of the RF power amplifiers does most of the work while the other RF power amplifiers idle.

Moreover, a drawback of known multi-channel transmit MR systems is that the asymmetry in the RF power demand changes according to, for example, a changed patient anatomy and/or a changed imaging task. For this reason it is necessary in conventional multi-channel systems to employ RF power amplifiers in all channels having sufficient excess power capabilities in order to be able to fulfill the requirements in any possible application. This results disadvantageously in increased system costs.

SUMMARY OF THE INVENTION

From the foregoing it is readily appreciated that there is a need for an improved MR imaging technique. It is consequently an object of the invention to provide a MR method and a MR device that uses the available power capabilities of the RF power amplifiers efficiently for all possible applications. Unused power capabilities in the transmit chain of a MR apparatus should be avoided to the largest possible extent.

In accordance with the invention, a method of MR imaging of at least a portion of a body of a patient placed in an examination volume of a MR device is disclosed. The method of the invention comprises the following steps:

subjecting the portion of the body to an imaging sequence comprising RF pulses and switched magnetic field gradients, the RF pulses being transmitted toward the portion of the body via a RF coil arrangement surrounding the examination volume, wherein RF signals are supplied to the RF coil arrangement via two or more transmit channels in an asymmetric fashion relative to a horizontal and/or vertical axis of the cross section of the portion of the body;

acquiring MR signals from the portion of the body (110); and reconstructing a MR image from the acquired MR signals.

The gist of the invention is the application of RF energy to the RF coil arrangement of the used MR apparatus in a geometrically suitable asymmetric fashion relative to the horizontal and/or vertical axis of the imaged body, which is appropriate for most applications. The power demand for obtaining a homogeneous $B_1$ field is asymmetric according to the invention, exactly like in the prior art. It turns out, however, that the asymmetry is qualitatively the same for the different imaging applications, which is due to the special asymmetric RF feeding of the RF coil arrangement. Consequently, the power demand in one transmit channel is always smaller than the power demand in another transmit channel. Hence, it is possible to make provision for RF power amplifiers having different power capabilities in the different transmit channels. An unused excess of RF power capability, which is always present in known multi-channel transmit systems for the reasons described above, can be avoided by the invention. This results in significantly reduced system costs.

The RF coil arrangement used in accordance with the invention may be a birdcage resonator comprising a plurality of rungs arranged in parallel to a longitudinal axis of the body of the imaged patient, wherein the birdcage resonator comprises two or more RF drive ports connected to different rungs. Due to the asymmetric positioning of the rungs to which RF power is supplied, the power demand in one channel will always be smaller than the power demand in the other channel. Hence, a RF power amplifier having a smaller power capability can be connected to one of the RF drive ports, while a RF power amplifier having a larger power capability can be connected to the other RF drive port. The total installed RF power can be reduced significantly in this way without constraining the general usability of the system for different imaging applications.

The invention does not only relate to a MR method but also to a MR device. According to the invention the MR device includes:

a main magnet for generating a uniform, steady magnetic field within an examination volume along a main field axis, a number of gradient coils for generating switched magnetic field gradients in different spatial directions within the examination volume, at least one RF coil arrangement for generating RF pulses within the examination volume and/or for receiving MR signals from a body of a patient positioned in the examination volume, which RF coil arrangement surrounds the examination volume and comprises two or more RF drive ports connected to resonator elements of the RF coil arrangement, which resonator elements are positioned asymmetrically relative to a horizontal and/or vertical axis of the cross section of the RF coil arrangement and/or of the body of the patient, a control unit for controlling the temporal succession of RF pulses and switched magnetic field gradients, a reconstruction unit, and a visualization unit.

According to yet another aspect of the invention, a multi-channel transmit unit for supplying RF power signals to a RF coil arrangement of a MR device is disclosed, wherein the transmit unit comprises two or more transmit channels, each transmit channel including a RF power amplifier, wherein the RF power amplifiers of the different transmit channels have unequal power capabilities. Such a multi-channel transmit unit can be used in combination with a MR device, in which RF power signals Are supplied to the RF coil arrangement in a geometrically asymmetric fashion relative to the symmetry of the imaged body portion of the patient. Because of the unequal power capabilities of the RF power amplifiers, an unused excess of installed RF power is avoided and overall systems costs are reduced. It turns out that the invention enables to realize a multi-channel transmit unit, in which the power capability of a RF power amplifier of one transmit channel is at least double the power capability of a RF power amplifier of another transmit channel. In practice the total installed RF power can be reduced by up to 35% as compared to conventional systems, in which the RF coil arrangement is symmetrically driven. Moreover, the multi-channel transmit unit of the invention can be used in a very flexible manner in all cases in which an asymmetric RF power demand occurs. To this end the multi-channel transmit unit of the invention may advantageously comprise a commutator which enables to selectively connect each RF power amplifier to each RF drive port of the RF coil arrangement. The commutator may be controllable by the control unit of the respective MR device.

BRIEF DESCRIPTION OF THE DRAWINGS

The enclosed drawings disclose preferred embodiments of the present invention. It should be understood, however, that the drawings are designed for the purpose of illustration only and not as a definition of the limits of the invention. In the drawings.

DETAILED DESCRIPTION OF EMBODIMENTS

Figure 1:
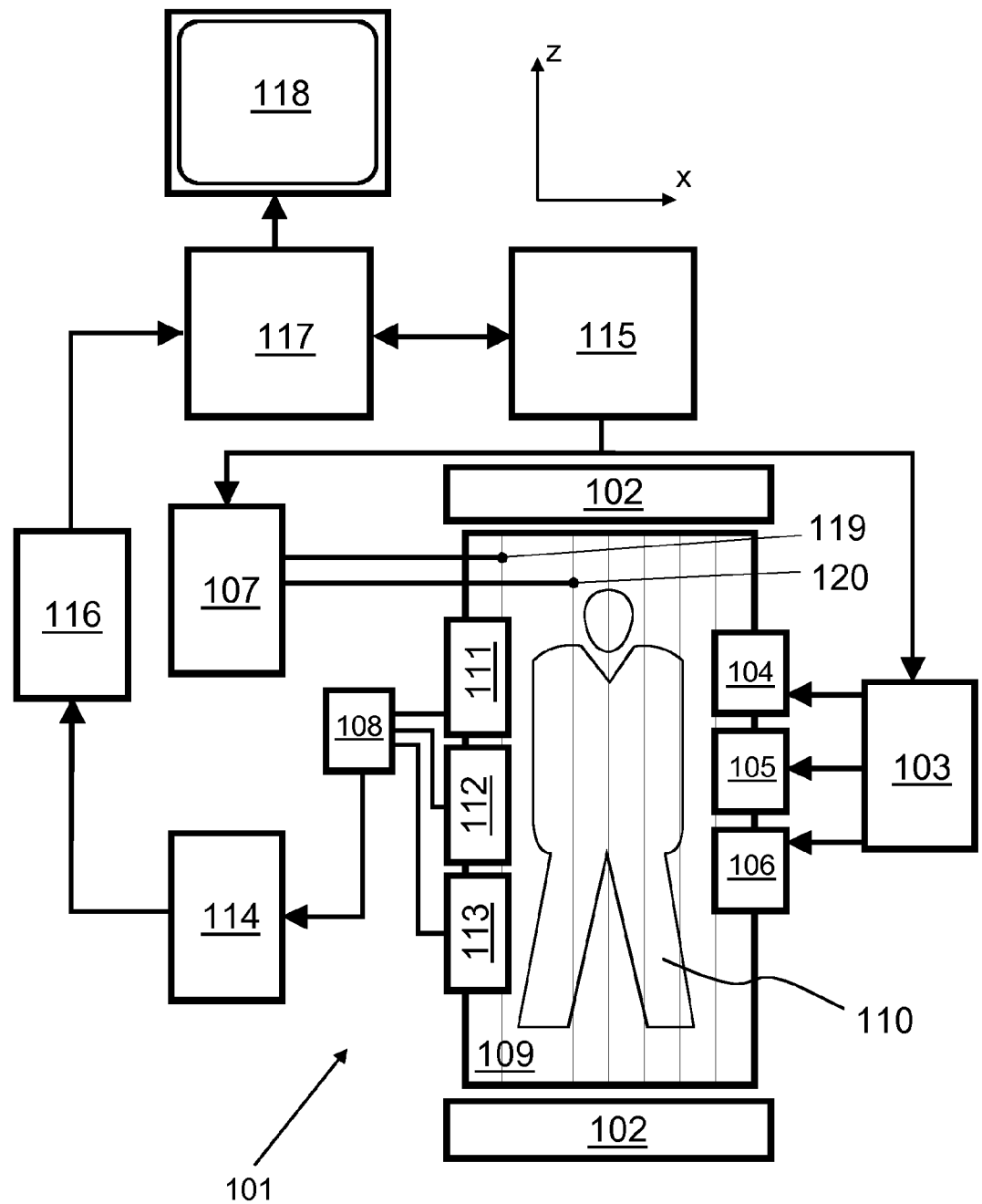
FIG. 1 shows a MR device according to the invention.

With reference to FIG. 1, a MR device 101 is shown. The device comprises superconducting or resistive main magnet coils 102 such that a substantially uniform, temporally constant main magnetic field is created along a z-axis through an examination volume.

A magnetic resonance generation and manipulation system applies a series of RF pulses and switched magnetic field gradients to invert or excite nuclear magnetic spins, induce magnetic resonance, refocus magnetic resonance, manipulate magnetic resonance, spatially and otherwise encode the magnetic resonance, saturate spins, and the like to perform MR imaging.

Most specifically, a gradient pulse amplifier 103 applies current pulses to selected ones of whole-body gradient coils 104, 105 and 106 along x, y and z-axes of the examination volume. A digital multi-channel RF frequency transmitter 107 transmits RF pulses or pulse packets via two RF drive ports 119, 120 to a whole-body volume RF coil 109 to transmit RF pulses into the examination volume.

A typical MR imaging sequence is composed of a packet of RF pulse segments of short duration which taken together with each other and any applied magnetic field gradients achieve a selected manipulation of nuclear magnetic resonance. The RF pulses are used to saturate, excite resonance, invert magnetization, refocus resonance, or manipulate resonance and select a portion of a body 110 positioned in the examination volume. The MR signals are also picked up by the whole-body volume RF coil 109.

For generation of MR images of limited regions of the body 110 by means of parallel imaging, a set of local array RF coils 111, 112, 113 are placed contiguous to the region selected for imaging. The array coils 111, 112, 113 can be used to receive MR signals induced by body-coil RF transmissions.

The resultant MR signals are picked up in the depicted embodiment by the array RF coils 111, 112, 113 and demodulated by a receiver 114 preferably including a preamplifier (not shown). The receiver 114 is connected to the RF coils 111, 112 and 113 via switch 108.

A host computer 115 controls the gradient pulse amplifier 103 and the transmitter 107 to generate any of a plurality of MR imaging sequences, such as echo planar imaging (EPI), echo volume imaging, gradient and spin echo imaging, fast spin echo imaging, and the like. For the selected sequence, the receiver 114 receives a single or a plurality of MR data lines in rapid succession following each RF excitation pulse. A data acquisition system 116 performs analog-to-digital conversion of the received signals and converts each MR data line to a digital format suitable for further processing. In modern MR devices the data acquisition system 116 is a separate computer which is specialized in acquisition of raw image data.

Ultimately, the digital raw image data is reconstructed into an image representation by a reconstruction processor 117 which applies a Fourier transform and other appropriate reconstruction algorithms, such like SENSE or SMASH. The MR image may represent a planar slice through the patient, an array of parallel planar slices, a three-dimensional volume, or the like. The image is then stored in an image memory where it may be accessed for converting slices, projections, or other portions of the image representation into appropriate format for visualization, for example via a video monitor 118 which provides a man-readable display of the resultant MR image.

Figure 2:
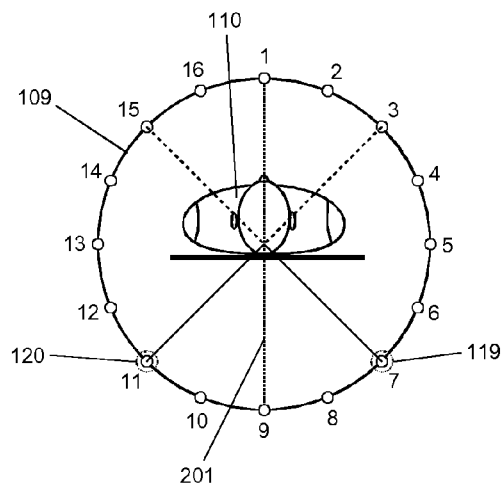
FIG. 2 shows a cross section of a RF coil arrangement with RF drive ports positioned in a conventional manner.
Figure 3:
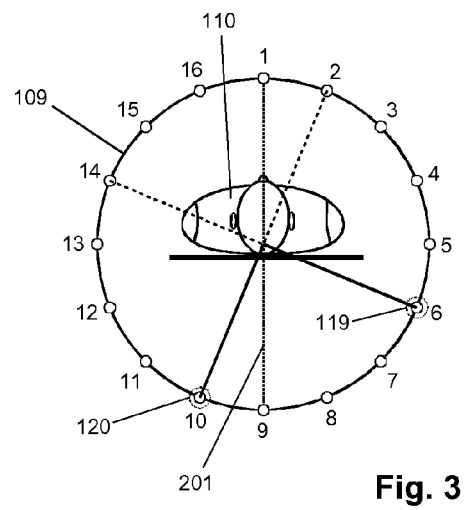
FIG. 3 shows a cross section of a RF coil arrangement with RF drive ports positioned according to the invention.
Figure 4:
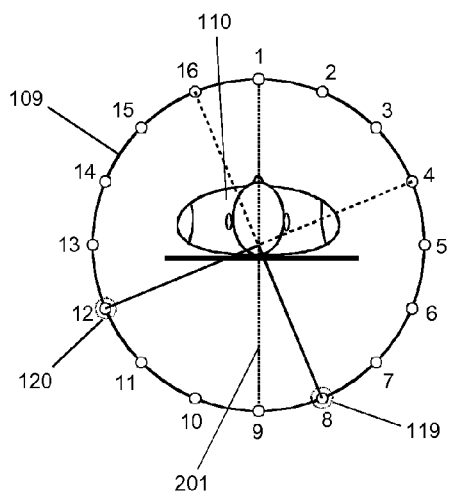
FIG. 4 shows a cross section of a RF coil arrangement with RF drive ports positioned according to the invention.

With continuing reference to FIG. 1 and with further reference to FIGS. 2, 3, and 4, the asymmetric RF driving of the RF coil arrangement 109 according to the invention is described for the case of a birdcage resonator as a RF coil arrangement 109.

FIGS. 2, 3, and 4 show cross sections of birdcage resonators comprising a plurality of rungs 1 to 16 arranged in parallel to the main field axis z. The birdcage resonator surrounds the examination volume of the MR device 1. As depicted in FIGS. 2 and 3, the body 110 of the patient is positioned within the birdcage resonator close to its centre. FIGS. 2, 3, and 4 further show a vertical symmetry axis 201 of the birdcage resonator which constitutes simultaneously a vertical symmetry axis of the body 110 of the patient.

FIG. 2 shows the conventional approach, in which the RF drive ports 119 and 120 are connected to rungs 7 and 11, i.e. in a symmetrical fashion relative to the vertical axis 201.

FIG. 3 shows an arrangement according to the invention, in which the two RF drive ports 119 and 120 are connected to rungs 6 and 10 which are positioned asymmetrically with respect to the vertical axis 201 of the cross section of the RF coil arrangement 109. The angular distance between the RF drive ports 6 and 10 is 90 degrees.

FIG. 4 shows a further arrangement according to the invention, wherein the RF drive ports 119 and 120 are connected to rungs 8 and 12 which are again positioned asymmetrically with respect to the vertical axis 201 of the cross section of the RF coil arrangement 109.

Figure 5:
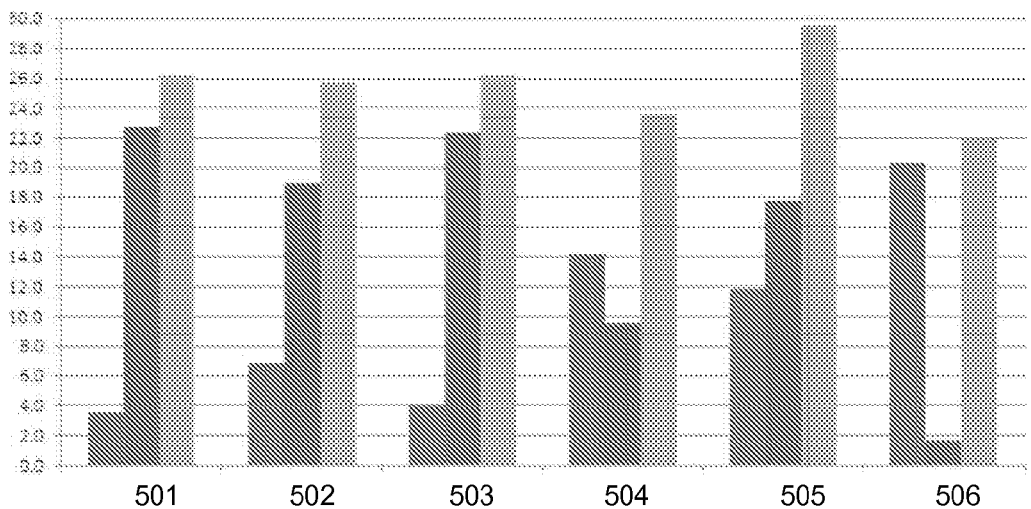
FIG. 5 shows diagrams illustrating the power level of the RF signals supplied via the RF drive ports in the RF coil arrangements of FIGS. 2 and 3.

The diagrams in FIG. 5 show the RF power (in kW) required to achieve optimum RF uniformity in different arrangements and applications. In each of the diagrams 501 to 506 the left column shows the RF power in the first transmit channel, while the middle column shows the RF power in the second channel. The right column shows the total RF power demand.

Diagram 501 in FIG. 5 relates to the case of body (torso) imaging using the configuration of the invention as shown in FIG. 3, in which the first transmit channel is connected to RF drive port 119 while the second transmit channel is connected to RF drive port 120. It turns out that the RF power demand in the first transmit channel is much smaller than the RF power demand in the second channel for obtaining maximum RF homogeneity. In fact, the RF power in the first channel amounts to less than 4.0 kW while the RF power in the second channel amounts to more than 22.0 kW. The situation is similar in the case of diagram 502. Diagram 502 shows the situation for breast imaging using the same configuration of the RF drive ports 119, 120 (FIG. 3). Again, the RF power in the first transmit channel is much smaller than the RF power in the second transmit channel in order to achieve optimum RF uniformity.

The situation changes significantly when the conventional configuration as shown in FIG. 2 is used, in which the RF drive ports 119 and 120 are arranged symmetrically relative to the vertical axis 201. Diagram 503 shows the case of body (torso) imaging. In this case, the RF power in the first transmit channel is again smaller than the RF power in the second transmit channel. Diagram 504 relates to the case of breast imaging using the configuration shown in FIG. 2. Here the situation is inverted. The RF power in the first transmit channel is larger than the RF power in the second transmit channel.

Diagrams 505 and 506 again refer to the cases of body (torso) imaging and breast imaging respectively. The RF drive ports are connected to rungs 8 and 12 (FIG. 4). As can be seen in the diagrams 505 and 506, the RF power demand is again asymmetric but also qualitatively different for the different imaging applications.

As can be seen from diagrams 501 and 502 in FIG. 5, RF shimming for body (torso) imaging and breast imaging always yields an asymmetric RF power distribution over the two transmit channels, wherein the small and large RF power demands occur in the same channels. This can be exploited according to the invention by using a transmit unit 107 for supplying the RF energy to the RF drive ports 119 and 120, wherein the transmit channels of the transmit unit 107 include RF power amplifiers having unequal power capabilities. For the case shown in FIG. 3, the power capability of the RF power amplifier in the first transmit channel can be less than half of the power capability of the RF power amplifier in the second transmit channel. The total installed RF power can be reduced by at least 25%. In practice, the reduction factor may be up to 35% as compared to the conventional situation illustrated in FIG. 2. Hence, the invention helps to reduce the total power requirements and consequently the associated system costs.

Figure 6:
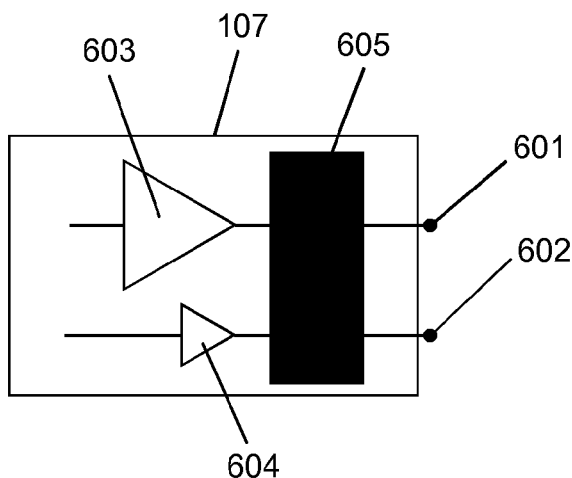
FIG. 6 schematically shows a multi-channel transmit unit according to the invention.

FIG. 6 schematically shows the two-channel RF transmit unit 107 of the invention. The transmit unit 107 is used for supplying RF power to RF coil arrangement 109. To this end output ports 601 and 602 are connected to the RF drive ports 119 and 120 of the RF coil arrangement 109. The transmit unit 107 comprises two transmit channels, wherein each transmit channel includes a RF power amplifier 603, 604. The RF power amplifiers 603, 604 have unequal power capabilities. The power capabilities of the two RF power amplifiers 603, 604 can be selected according to the diagrams shown in FIG. 5, depending on the respective arrangement of the RF drive ports 119, 120. The RF power amplifiers 603, 604 are connected to the output ports 601, 602 via a commutator 605, by which each RF power amplifier 603, 604 is selectively connectible to one of the output ports 601, 602 of the multi-channel transmit unit 107. This allows to employ the RF transmit unit 107 depicted in FIG. 6 even in the arrangement shown in FIG. 4. According to diagrams 505 and 506 in FIG. 5, the RF power distribution is asymmetric for body (torso) and breast imaging respectively. However, the small and large RF power demands occur in different channels for body (torso) and breast imaging. The commutator 605 enables to use the RF transmit unit 107 for both body (torso) and breast imaging in the arrangement shown in FIG. 4.

Figure 7:
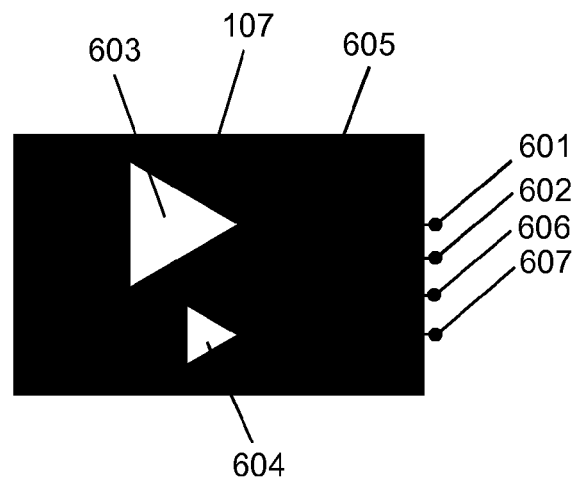
FIG. 7 shows a further embodiment of a multi-channel transmit unit according to the invention.

Another embodiment is shown in FIG. 7, in which the RF transmit 107 comprises for output ports 601, 602, 606, 607. The commutator 605 enables to switchably connect each RF power amplifier 603, 604 arbitrarily to one of the output ports 601, 602, 606, 607. Output ports 601, 602 may be connected to rungs 6 and 10 while output ports 606 and 607 are connected to rungs 8 and 12. In this case the arrangement shown in FIG. 3 can be used for body (torso) imaging (see diagram 501 in FIG. 5), while the arrangement shown in FIG. 4 can be used for breast imaging (see diagram 506 in FIG. 5). This advantageously enables to use RF power amplifiers 603, 604 having most significantly different power capabilities. The power capability of amplifier 603 should be 22 kW, while a power capability of only 4 kW is sufficient for amplifier 604.

In the above description body (torso) and breast imaging are mentioned as exemplary applications. It has to be noted, however, that the method and apparatus of the invention can be used with advantage as well for head imaging, cardiac imaging, liver imaging, imaging of the extremities and other imaging tasks.

The invention claimed is:

1. A method of magnetic resonance (MR) imaging of at least a portion of a body of a patient placed in an examination volume of a MR device, the method comprising the steps of:
    subjecting the portion of the body to an imaging sequence comprising RF pulses and switched magnetic field gradients, the RF pulses being transmitted toward the portion of the body via a RF coil arrangement surrounding the examination volume, wherein RF signals are supplied to the RF coil arrangement via two or more transmit channels in an asymmetric fashion relative to a horizontal and/or vertical axis of the cross section of the portion of the body;
    acquiring MR signals from the portion of the body; and
    reconstructing a MR image from the acquired MR signals, wherein the RF pulses are transmitted by supplying RF signals in parallel via the two or more transmit channels at different power levels by way of a transmit unit for transmitting the RF signal to the RF coil arrangement, which transmit unit has two or more transmit channels, each transmit channel being connected to one RF drive port of the RF coil arrangement and wherein each transmit channel comprises a RF power amplifier, and wherein the RF power amplifiers of the different transmit channels have different power capabilities.

2. The method of claim 1, wherein the RF coil arrangement is a birdcage resonator comprising a plurality of rungs arranged in parallel to a longitudinal axis of the body of the patient, wherein the birdcage resonator comprises two or more RF drive ports connected to different rungs, wherein RF signals are supplied via the two or more RF drive ports to two or more rungs arranged in an asymmetric fashion relative to a horizontal and/or vertical axis of the cross section of the portion of the body.

3. A magnetic resonance (MR) device for carrying out the method claimed in claim 1, which MR device includes:
    a main magnet for generating a uniform, steady magnetic field within an examination volume along a main field axis,
    a number of gradient coils for generating switched magnetic field gradients in different spatial directions within the examination volume,
    at least one RF coil arrangement for generating RF pulses within the examination volume and/or for receiving MR signals from a body of a patient positioned in the examination volume, which RF coil arrangement surrounds the examination volume and comprises two or more RF drive ports connected to resonator elements of the RF coil arrangement, which resonator elements are arranged asymmetrically with respect to a horizontal and/or vertical axis of the cross section of the RF coil arrangement and/or of the body of the patient,
    further comprising a transmit unit for transmitting RF signal to the RF coil arrangement, which transmit unit has two or more transmit channels, each transmit channel being connected to one RF drive port of the RF coil arrangement and wherein each transmit channel comprises a RF power amplifier, and wherein the RF power amplifiers of the different transmit channels have different power capabilities,
    a control unit for controlling the temporal succession of RF pulses and switched magnetic field gradients,
    a reconstruction unit, and
    a visualization unit.

4. The MR device of claim 3, wherein the RF power amplifiers are connected to the RF drive ports via a commutator, by which each RF power amplifier is selectively connectable to one of the RF drive ports of the RF coil arrangement.

5. The MR device of claim 3, wherein the RF coil arrangement is a birdcage resonator comprising a plurality of rungs arranged in parallel to the main field axis, and wherein the birdcage resonator comprises two or more RF drive ports connected to two or more different rungs.

6. A multi-channel transmit unit for supplying RF power signals to a RF coil arrangement of a MR device, wherein the transmit unit comprises two or more transmit channels, each transmit channel including a RF power amplifier, the RF power amplifiers of the different transmit channels having unequal power capabilities.

7. The multi-channel transmit unit of claim 6, wherein the power capability of a RF power amplifier of one transmit channel is at least double the power capability of a RF power amplifier of another transmit channel.

8. The multi-channel transmit unit of claim 6, wherein the RF power amplifiers are connected to output ports via a commutator, by which each RF power amplifier is selectively connectible to one of the output ports of the multi-channel transmit unit.

* * * * *